(12) United States Patent
Coxeter et al.

(10) Patent No.: US 11,668,026 B2
(45) Date of Patent: Jun. 6, 2023

(54) FABRIC ITEMS WITH ELECTRICAL COMPONENTS

(71) Applicant: Apple Inc., Cupertino, CA (US)

(72) Inventors: Peter F. Coxeter, Sunnyvale, CA (US); Didio V. Gomes, Sunnyvale, CA (US); Benjamin J. Grena, Sunnyvale, CA (US); Steven J. Keating, Sunnyvale, CA (US); David M. Kindlon, Felton, CA (US); Maurice P. May, Sunnyvale, CA (US); Daniel A. Podhajny, San Jose, CA (US); Andrew L. Rosenberg, Sunnyvale, CA (US); Daniel D. Sunshine, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 599 days.

(21) Appl. No.: 16/415,486

(22) Filed: May 17, 2019

(65) Prior Publication Data

US 2020/0087823 A1 Mar. 19, 2020

Related U.S. Application Data

(60) Provisional application No. 62/733,461, filed on Sep. 19, 2018.

(51) Int. Cl.
*D03D 1/00* (2006.01)
*D02G 3/44* (2006.01)
(Continued)

(52) U.S. Cl.
CPC ........... *D03D 1/0088* (2013.01); *D02G 3/441* (2013.01); *H05K 1/038* (2013.01); *H05K 3/34* (2013.01); *H05K 2201/029* (2013.01)

(58) Field of Classification Search
CPC .................................................. D03D 1/0088
See application file for complete search history.

(56) References Cited

U.S. PATENT DOCUMENTS

| | | | |
|---|---|---|---|
| 6,523,968 B1* | 2/2003 | Walker | D03D 13/004 28/163 |
| 6,729,025 B2 | 5/2004 | Farrell et al. | |

(Continued)

FOREIGN PATENT DOCUMENTS

| | | |
|---|---|---|
| CN | 1875136 A | 12/2006 |
| CN | 103228103 A | 7/2013 |

(Continued)

*Primary Examiner* — Andrew T Piziali
(74) *Attorney, Agent, or Firm* — Treyz Law Group, P.C.; Kendall P. Woodruff

(57) ABSTRACT

A fabric-based item may include fabric formed from intertwined strands of material. The fabric may include first and second fabric layers that at least partially surround a pocket. Initially, the pocket may be completely enclosed by the first and second layers of fabric. A shim may be placed in the pocket before the pocket is closed. An opening may be formed in the first layer of fabric to expose a conductive strand in the pocket. The shim may prevent the cutting tool from cutting all the way through to the second layer of fabric. After cutting the hole in the first layer of fabric, the shim may be removed and an electrical component may be soldered to the conductive strand in the pocket. A polymer material may be injected into the pocket to encapsulate the electrical component. The polymer material may interlock with the surrounding pocket walls.

19 Claims, 8 Drawing Sheets

(51) Int. Cl.
*H05K 1/03* (2006.01)
*H05K 3/34* (2006.01)

(56) References Cited

U.S. PATENT DOCUMENTS

| | | | |
|---|---|---|---|
| 7,022,917 | B2 | 4/2006 | Jung et al. |
| 2007/0049147 | A1 | 3/2007 | Hill et al. |
| 2010/0085753 | A1* | 4/2010 | Van Pieterson ........... G09F 9/33 |
| | | | 362/249.02 |
| 2012/0030935 | A1 | 2/2012 | Slade et al. |
| 2012/0099299 | A1* | 4/2012 | Gorson .................. A41D 1/002 |
| | | | 29/428 |
| 2016/0356449 | A1* | 12/2016 | Jorro de Inza ........ B60Q 3/745 |
| 2017/0251555 | A1 | 8/2017 | Sunshine et al. |

FOREIGN PATENT DOCUMENTS

| | | | | |
|---|---|---|---|---|
| CN | 104723640 | A | 6/2015 | |
| CN | 105493650 | A | 4/2016 | |
| CN | 105774137 | A | 7/2016 | |
| CN | 107923081 | A | 4/2018 | |
| DE | 102016223208 | A1 | 5/2018 | |
| EP | 2784198 | A1 | 10/2014 | |
| GB | 2396252 | A * | 6/2004 | ............. G09F 21/02 |
| JP | 2004322157 | A | 11/2004 | |
| JP | 2006517618 | A | 7/2006 | |
| WO | 2004096483 | A1 | 11/2004 | |
| WO | 2017030851 | A2 | 2/2017 | |

\* cited by examiner

FABRIC ITEMS WITH ELECTRICAL COMPONENTS

This application claims the benefit of provisional patent application No. 62/733,461, filed Sep. 19, 2018, which is hereby incorporated by reference herein in its entirety.

FIELD

This relates generally to fabric-based items and, more particularly, to fabric-based items with electrical components.

BACKGROUND

It may be desirable to form bags, furniture, clothing, wearable electronic devices, and other items using fabric. In some arrangements, it may be desirable to incorporate electrical circuitry into fabric. If care is not taken, however, fabric-based items may not offer desired features. For example, fabric-based items may include circuitry that is bulky, heavy, unattractive, and susceptible to damage.

SUMMARY

A fabric-based item may include fabric formed from intertwined strands of material. The fabric may include first and second fabric layers that are intertwined to form a pocket. During weaving, a shim may be placed in the pocket before the pocket is closed. After the shim is placed into the pocket, the pocket may be closed.

A cutting tool may be used to create an opening in the first layer of fabric to expose a conductive strand in the pocket. The shim may prevent the cutting tool from cutting all the way through to the second layer of fabric. After cutting the hole in the first layer of fabric, the shim may be removed and an electrical component may be soldered to the conductive strand in the pocket. A polymer material may be injected into the pocket to encapsulate the electrical component. The polymer material may interlock with the surrounding pocket walls.

In some arrangements, the cutting tool may create openings in the first and second layers of fabric. To create openings with different dimensions or shapes, one or more shims may be used to prevent the cutting tool from cutting all the way through to the other side of the fabric.

DETAILED DESCRIPTION

Figure 1:
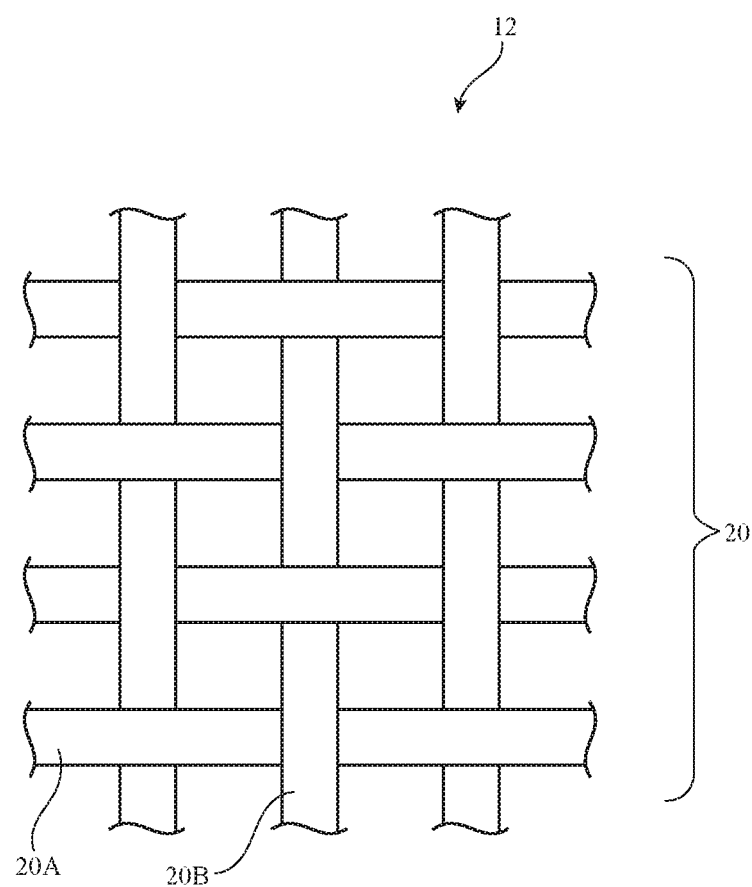
FIG. 1 is a side view of illustrative woven fabric in accordance with an embodiment.

Items may include fabric. A cross-sectional side view of illustrative woven fabric 12 is shown in FIG. 1. As shown in FIG. 1, fabric 12 may include strands 20 such as warp strands 20A and weft strands 20B. In the illustrative configuration of FIG. 1, fabric 12 has a single layer of woven strands 20. Multi-layer fabric constructions may be used for fabric 12 if desired.

Figure 2:
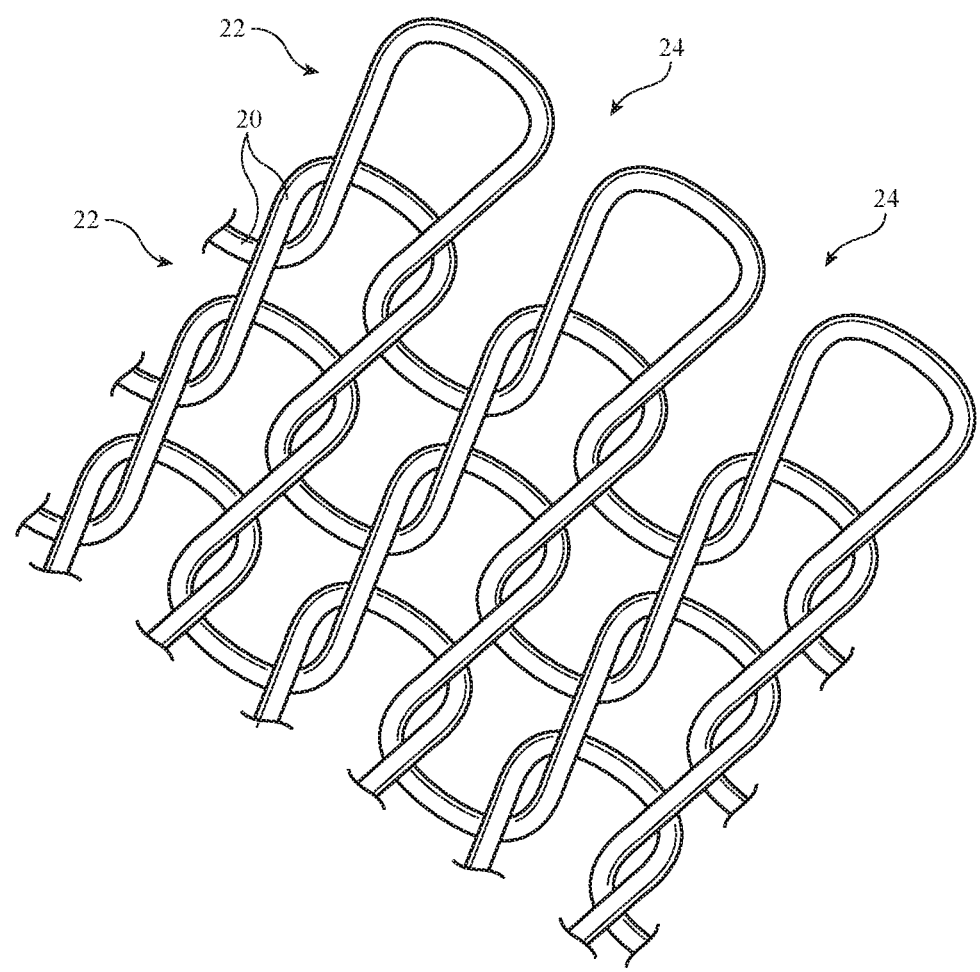
FIG. 2 is a top view of illustrative knit fabric in accordance with an embodiment.

As shown in FIG. 2, fabric 12 may be a knit fabric. In the illustrative configuration of FIG. 2, fabric 12 has a single layer of knit strands 20 that form horizontally extending rows of interlocking loops (courses 22) and vertically extending wales 24. Other types of knit fabric may be used in item 10, if desired.

Figure 3:
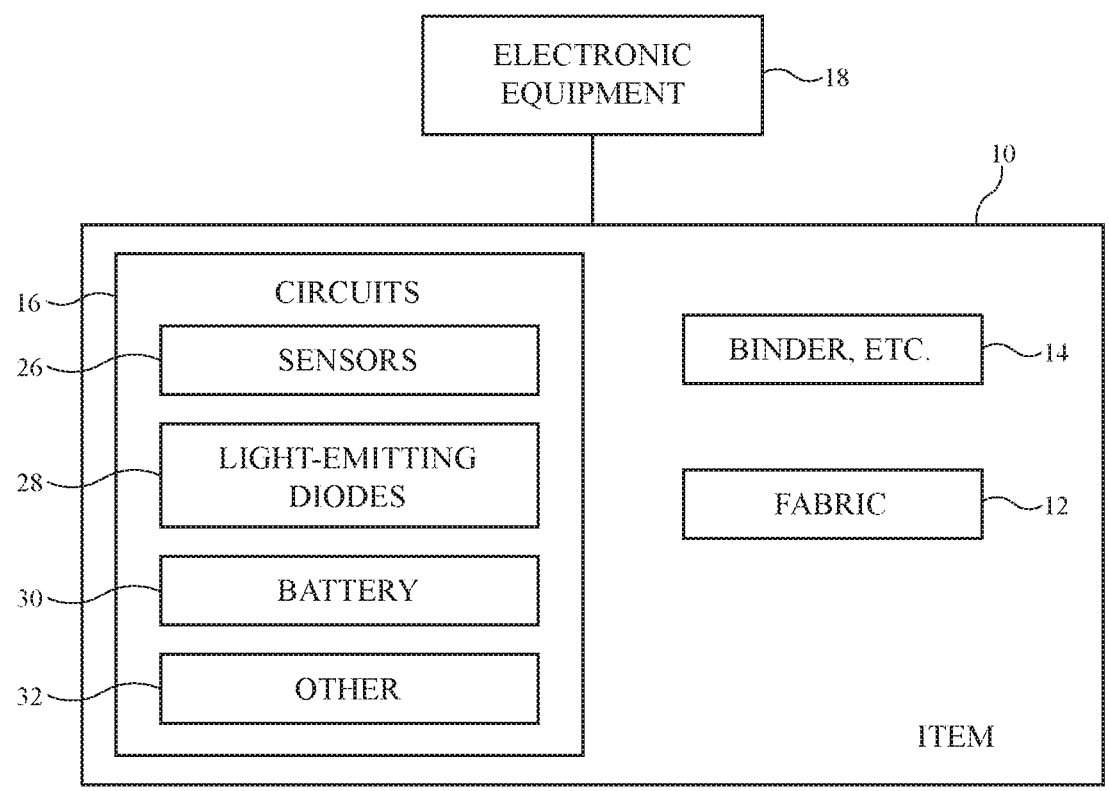
FIG. 3 is a schematic diagram of an illustrative fabric-based item in accordance with an embodiment.

An illustrative fabric-based item is shown in FIG. 3. Fabric-based item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, a remote control, an embedded system such as a system in which fabric-based item 10 is mounted in a kiosk, in an automobile, airplane, or other vehicle, other electronic equipment, or may be equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, sock, glove, shirt, pants, etc.), or may be any other suitable fabric-based item.

Item 10 may include intertwined strands of material that form fabric 12. Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 12 may be single-filament strands (sometimes referred to as fibers or monofilaments), may be yarns or other strands that have been formed by intertwining multiple filaments (multiple monofilaments) of material together, or may be other types of strands (e.g., tubing that carries fluids such as gases or liquids). The strands may include extruded strands such as extruded monofilaments and yarn formed from multiple extruded monofilaments. Monofilaments for fabric 12 may include polymer monofilaments and/or other insulating monofilaments and/or may include bare wires and/or insulated wires. Monofilaments formed from polymer cores with metal coatings and monofilaments formed from three or more layers (cores, intermediate layers, and one or more outer layers each of which may be insulating and/or conductive) may also be used.

Yarns in fabric 12 may be formed from polymer, metal, glass, graphite, ceramic, natural materials as cotton or bamboo, or other organic and/or inorganic materials and combinations of these materials. Conductive coatings such as metal coatings may be formed on non-conductive material. For example, plastic yarns and monofilaments in fabric 12 may be coated with metal to make them conductive. Reflective coatings such as metal coatings may be applied to make yarns and monofilaments reflective. Yarns may be formed from a bundle of bare metal wires or metal wire intertwined with insulating monofilaments (as examples).

Strands of material may be intertwined to form fabric 12 using intertwining equipment such as weaving equipment, knitting equipment, or braiding equipment. Intertwined strands may, for example, form woven fabric, knit fabric, braided fabric, etc. Conductive strands and insulating strands may be woven, knit, braided, or otherwise intertwined to form contact pads that can be electrically coupled to conductive structures in item 10 such as the contact pads of an electrical component. The contacts of an electrical component may also be directly coupled to an exposed metal segment along the length of a conductive yarn or monofilament.

Conductive and insulating strands may also be woven, knit, or otherwise intertwined to form conductive paths. The conductive paths may be used in forming signal paths (e.g., signal buses, power lines, etc.), may be used in forming part of a capacitive touch sensor electrode, a resistive touch sensor electrode, or other input-output device, or may be used in forming other patterned conductive structures. Conductive structures in fabric 12 may be used in carrying power signals, digital signals, analog signals, sensor signals, control signals, data, input signals, output signals, or other suitable electrical signals.

Item 10 may include additional mechanical structures 14 such as polymer binder to hold strands in fabric 12 together, support structures such as frame members, housing structures (e.g., an electronic device housing), and other mechanical structures.

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, adhesive bonds (e.g., conductive adhesive bonds such as anisotropic conductive adhesive bonds or other conductive adhesive bonds), crimped connections, or other electrical and/or mechanical bonds. Circuitry 16 may include metal structures for carrying current, electrical components such as integrated circuits, sensors (e.g., sensors 26), light-emitting diodes (see, e.g., light-emitting diodes 28), battery 30, and other components 32 (e.g., controller circuitry for applying currents and/or magnetic fields to materials, and other electrical devices). Control circuitry in circuitry 16 (e.g., control circuitry formed from one or more integrated circuits such as microprocessors, microcontrollers, application-specific integrated circuits, digital signal processors, etc.) may be used to control the operation of item 10 by controlling electrically controllable (electrically adjustable) components in circuitry 16 and may be used to support communications with item 18 and/or other devices.

Item 10 may interact with additional items such as electronic equipment 18. Items such as equipment 18 may be attached to item 10 or item 10 and equipment (item) 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, or other structure that receives the electronic device in a pocket, an interior cavity, or other portion of item 10. In other situations, item 18 may be a wrist-watch device or other electronic device and item 10 may be a strap or other fabric-based item that is attached to item 18 (e.g., item 10 and item 18 may be used together to form a fabric-based item such as a wristwatch with a strap). In still other situations, item 10 may be an electronic device (e.g., a wearable device such as a wrist device, clothing, etc.), fabric 12 may be used in forming the electronic device, and additional items 18 may include accessories or other devices that interact with item 10. Signal paths formed from conductive yarns and monofilaments (e.g., insulated and bare wires) may be used to route signals in item 10 and/or item(s) 18.

The fabric that makes up item 10 may be formed from strands that are intertwined using any suitable intertwining equipment. With one suitable arrangement, which may sometimes be described herein as an example, fabric 12 may be woven fabric formed using a weaving machine. In this type of illustrative configuration, fabric may have a plain weave, a basket weave, a satin weave, a twill weave, or variations of these weaves, may be a three-dimensional woven fabric, or may be other suitable fabric. With other suitable arrangements, fabric 12 is knit or braided.

Fabric-based item 10 may include non-fabric materials (e.g., structures such as structures 14 that are formed from plastic, metal, glass, ceramic, crystalline materials such as sapphire, etc.). These materials may be formed using molding operations, extrusion, machining, laser processing, and other fabrication techniques. In some configurations, some or all of fabric-based item 10 may include one or more layers of material. The layers in item 10 may include layers of polymer, metal, glass, fabric, adhesive, crystalline materials, ceramic, substrates on which components have been mounted, patterned layers of material, layers of material containing patterned metal traces, thin-film devices such as transistors, and/or other layers.

Figure 4:
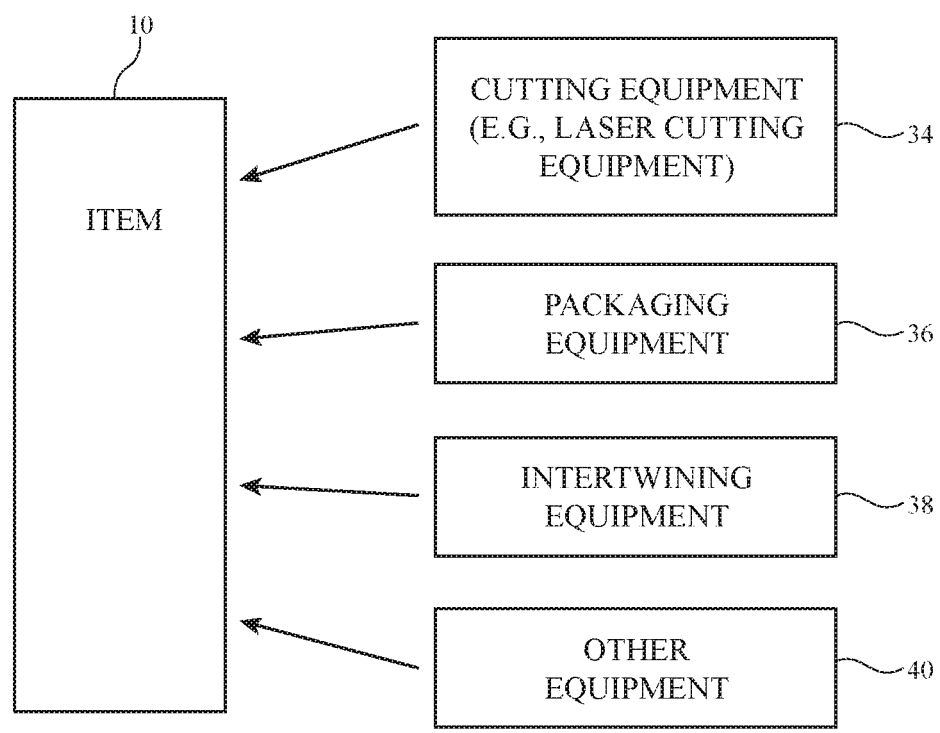
FIG. 4 is a diagram of illustrative equipment for forming a fabric-based item in accordance with an embodiment.

FIG. 4 is a diagram of illustrative equipment that may be used in forming fabric-based item 10. As shown in FIG. 4, this equipment may include cutting tools such as cutting equipment 34. Cutting equipment such as a trimming tool in equipment 34 (e.g., a laser cutting tool, a mechanical cutting tool, or other equipment for cutting yarn) may be used in cutting fabric 12. For example, a laser processing tool may be used to scan a beam of focused laser light across the surface of fabric 12, thereby cutting (i.e., cutting by thermal dissociation, ablation, etc.) through portions of fabric 12.

Packaging equipment 36 may include a soldering tool (e.g., a pick and place tool or other equipment for soldering integrated circuits and other components to conductive strands in fabric 12 in item 10). Equipment 36 may also include injection molding equipment, an encapsulation tool, or other equipment for molding or otherwise forming desired encapsulation layer structures (mold caps) on circuits 16 of item 10. Equipment 36 may, for example, include equipment for depositing liquid polymer material that forms a solid encapsulation layer after cooling and/or curing.

Intertwining equipment such as tool (equipment) 38 may include equipment such as weaving equipment, knitting equipment, and/or braiding equipment. Tool 38 may be used in forming fabric 12 from strands of material.

Additional equipment such as equipment 40 may be used to help form fabric 12, strands of material for fabric 12 (e.g., strands 20 of FIGS. 1 and 2), circuitry that is coupled to conductive structures in fabric 12, electrical components, housing structures, and other structures for forming item 10. Equipment 40 may, for example, include equipment for laminating fabric to layers of plastic, metal, and/or other materials, equipment for coating strands of material and/or for depositing layers of material on fabric 12, equipment for extruding strands of material, equipment for placing fluid in tubing, equipment for mounting integrated circuits, light-emitting diodes, sensors, buttons, and other electrical circuitry to fabric 12 and/or other portions of item 10, equipment for inserting structures into fabric 12 during fabrication of fabric 12, machining equipment for machining parts of item 10, robotic assembly equipment, and/or other equipment for forming item 10. The equipment of FIG. 4 may be used to form strands 20, to form fabric 12, to process fabric 12, to integrate circuitry 16, fabric 12, and/or additional structures 14 into item 10, and/or to perform other fabrication and processing operations on item 10.

Figure 5:
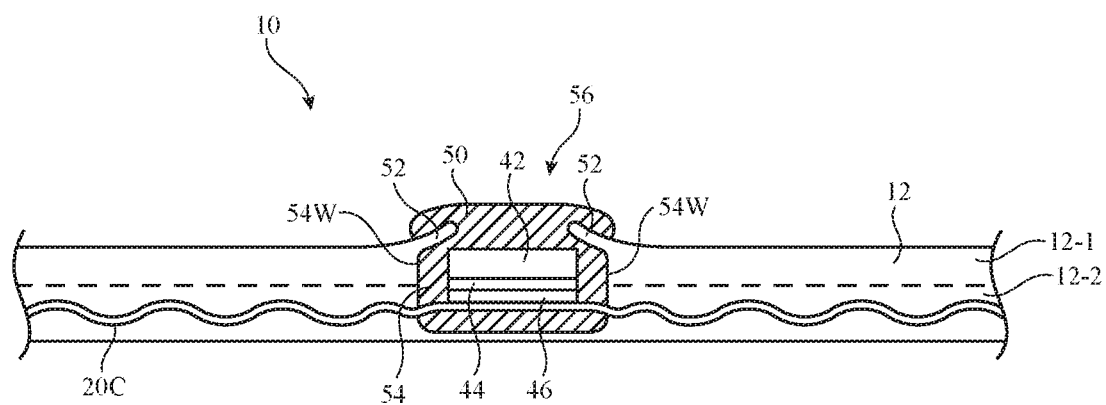
FIG. 5 is a cross-sectional side view of an illustrative fabric-based item having an electrical component mounted in a pocket and having a fabric opening filled with encapsulant in accordance with an embodiment.

A cross-sectional side view of an illustrative electrical component mounted to fabric in item 10 is shown in FIG. 5. Electrical components in item 10 such as illustrative electrical component 42 of FIG. 5 (e.g., an electrical component that forms part of circuitry 16 of FIG. 3) may include discrete electrical components such as resistors, capacitors, and inductors, may include connectors, may include input-output devices such as switches, buttons, light-emitting components such as light-emitting diodes, audio components such as microphones and speakers, vibrators (e.g., piezoelectric actuators that can vibrate), solenoids, electromechanical actuators, motors, and other electromechanical devices, microelectromechanical systems (MEMs) devices, pressure sensors, light detectors, proximity sensors (light-based proximity sensors, capacitive proximity sensors, etc.), force sensors (e.g., piezoelectric force sensors), strain gauges, moisture sensors, temperature sensors, accelerometers, gyroscopes, compasses, magnetic sensors (e.g., Hall effect sensors and magnetoresistance sensors such as giant magnetoresistance sensors), touch sensors, and other sensors, components that form displays, touch sensors arrays (e.g., arrays of capacitive touch sensor electrodes to form a touch sensor that detects touch events in two dimensions), and other input-output devices, electrical components that form control circuitry such as non-volatile and volatile memory, microprocessors, application-specific integrated circuits, system-on-chip devices, baseband processors, wired and wireless communications circuitry, and other integrated circuits. Electrical components such as component 42 may be bare semiconductor dies (e.g., laser dies, light-emitting diode dies, integrated circuits, etc.) or packaged components (e.g. semiconductor dies or other devices packaged within plastic packages, ceramic packages, or other packaging structures).

In the example of FIG. 5, component 42 is electrically coupled to one or more conductive strands in fabric 12 such as conductive strand 20C. Component 42 may have one or more electrical terminals (e.g., protruding leads, planar contacts, etc.) such as pad 44. Solder or other conductive material 46 may be used to couple pad 44 to conductive strand 20C. In some arrangements, component 42 may have two or more terminals (e.g., two or more contact pads 44) and each terminal may be coupled to a respective conductive strand 20C in fabric 12.

In some arrangements, it may be desirable to mount components such as component 42 completely or partially within fabric 12 rather than on the outer surface of fabric 12. As shown in FIG. 5, for example, component 42 may be at least partially embedded within fabric 12 by mounting component 42 within a pocket (e.g., a cavity) in fabric 12 such as pocket 54. Pocket 54 may be formed during weaving operations (or other fabric assembly operations). In particular, intertwining equipment 38 (e.g., weaving equipment, knitting equipment, braiding equipment, or other suitable intertwining equipment) may form pocket 54 by creating a space between two or more layers of fabric 12 (e.g., between upper fabric layer 12-1 and lower fabric layer 12-2). Pocket 54 may help orient component 42 so that solder pads 44 (and solder 46 on pads 44) are aligned with respective conductive strands 20C. During operation of item 10, conductive strands 20C may carry signals between component 42 and other circuitry in item 10.

Conductive strands in fabric 12 such as conductive strand 20C may form part of upper fabric layer 12-1, lower fabric layer 12-2, or other suitable fabric layer in fabric 12. One or more of conductive strands 20C may pass through pocket 54. Component 42 may be mechanically and electrically coupled to the portion of conductive strand 20C in pocket 54. Component 42 may be mounted to strand 20C during weaving operations or after weaving operations.

It may be desired to cover component 42 with one or more layers of material. For example, in configurations in which component 42 is sensitive to moisture, it may be desirable to seal component 42 within a waterproof material. In configurations in which component 42 emits light, it may be desirable to cover component 42 with a light-diffusing layer such as a polymer layer including metal oxide particles (e.g., white particles of titanium dioxide), other inorganic particles, organic particles, colored particles, or other light-diffusing particles. Opaque materials and/or materials with other optical, mechanical, and/or electrical properties may also be used to cover some or all of component 42.

In the illustrative configuration of FIG. 5, a polymer such as polymer 50 has been used to cover and encapsulate component 42, solder pad 44, solder 46, and adjacent portions of conductive strand 20C, thereby protecting component 42 from moisture and other environmental contaminants. Polymer 50 may be a thermoset or thermoplastic polymer and may sometimes be referred to as a mold cap (e.g., when polymer 50 is formed by molding plastic over component 42). If desired, other materials may be used to cover electrical components such as component 42. For example, polymer 50 may be a light-diffusing material such as a white potting compound (e.g., a polymer with white light scattering particles). Arrangements in which polymer 50 is used to encapsulate and protect electrical component 42 may sometimes be described herein as an illustrative example.

With one illustrative arrangement, which is sometimes described herein as an example, pocket 54 may be created using intertwining equipment 38. Initially, pocket 54 may be free of electrical components and may be fully enclosed by surrounding portions of fabric 12. After weaving, cutting equipment 34 may be used to cut an opening such as opening 56 in fabric 12 (e.g., in upper layer 12-1 of fabric 12) to open pocket 54 and expose conductive strands 20C. After removing the portion of fabric 12 covering pocket 54, packaging equipment 36 (e.g., a pick-and-place tool, other soldering tool, or other mounting equipment) may be used to solder or otherwise mount component 42 to conductive strand 20C. Packaging equipment 36 (e.g., an encapsulation tool) may then be used to encapsulate component 42 by injecting polymer 50 into pocket 54.

Polymer 50 may surround component 42, pad 44, solder 46, and portions of conductive strands 20C. Some of polymer 50 that is injected into pocket 54 may interlock with portions of fabric 12. For example, fabric 12 may have protruding edges such as edges 52 resulting from cutting opening 56 in fabric 12. When polymer 50 is injected into pocket 54, some of polymer 50 may surround (e.g., capture) protruding edges 52 of fabric 12. Polymer 50 may also interlock with pocket walls 54W surrounding pocket 54. This helps provide mechanical strength to the encapsulation provided by polymer 50 when polymer 50 solidifies.

In addition to protecting component 42 from moisture and other environmental contaminants, polymer 50 may be used to provide strain relief to conductive strands such as conductive strands 20C. In particular, polymer 50 may surround portions of conductive strands 20C in pocket 54, thereby keeping strands 20C separate from one another and helping to prevent component 42 from breaking off of conductive strands 20C.

In some arrangements, fabric 12 may be a stretchable fabric (e.g., for forming a wrist strap or other strap that is worn on a user's body). Stretchable fabrics may be stretched during weaving and may be stretched repeatedly during use. The presence of polymer 50 around conductive strands 20C and component 42 may help prevent conductive strands 20C and component 42 from being damaged when fabric 12 is stretched.

Figure 6:
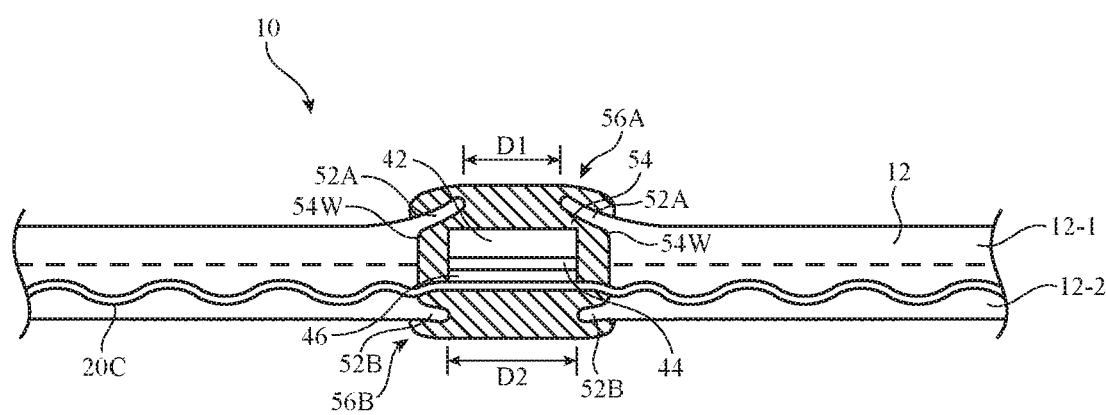
FIG. 6 is a cross-sectional side view of an illustrative fabric-based item having an electrical component mounted in a pocket and having first and second fabric openings filled with encapsulant in accordance with an embodiment.

If desired, openings may be formed in fabric 12 on opposing sides of pocket 54. This type of arrangement is illustrated in FIG. 6. As shown in FIG. 6, fabric 12 may have a first opening such as opening 56A formed in upper layer 12-1 of fabric 12 and a second opening such as opening 56B formed in lower layer 12-2 of fabric 12. If desired, fabric 12 may have one or more layers between upper fabric layer 12-1 and lower fabric layer 12-2.

Openings 56A and 56B may be formed using cutting equipment 34. Openings 56A and 56B may have the same dimensions or may have different dimensions. For example, in arrangements where openings 56A and 56B are circular, opening 56A may have a first diameter D1 and opening 56B may have a second diameter D2. D2 may be larger than D1, or D1 may be larger than D2. If desired, openings 56A and 56B may be non-circular (e.g., may have a square shape, rectangular shape, oval shape, or any other suitable shape) and/or opening 56A may have a different shape from opening 56B.

Cutting openings 56A and 56B in fabric 12 may result in upper protruding edges 52A and lower protruding edges 52B. Polymer material 50 may extend up and over protruding edges 52A and 52B, thereby interlocking with fabric 12. Polymer material 50 may also interlock with fabric walls 54W surrounding pocket 54.

As in the example of FIG. 5, polymer 50 of FIG. 6 may be used to provide environmental protection for component 42, may be used to provide strain relief to conductive strands such as conductive strands 20C, may be used to keep strands 20C separate from one another, may help prevent component 42 from breaking off of conductive strands 20C, and may help prevent conductive strands 20C and component 42 from being damaged when fabric 12 is stretched.

It can be challenging to mount components such as component 42 in fabric. If care is not taken, the fabric may be bulky or aesthetically unappealing, and/or the component may be susceptible to falling off or becoming damaged.

Figure 7:
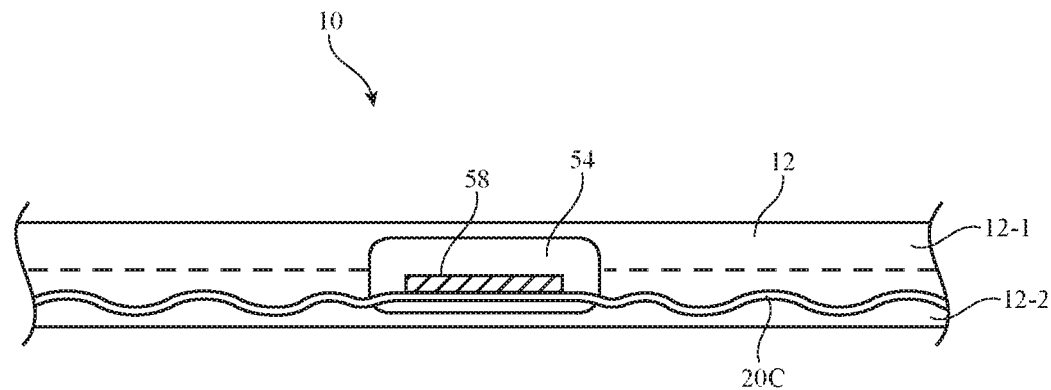
FIG. 7 is a cross-sectional side view of an illustrative fabric-based item of the type shown in FIG. 5 showing how a shim may be placed in a pocket in accordance with an embodiment.
Figure 8:
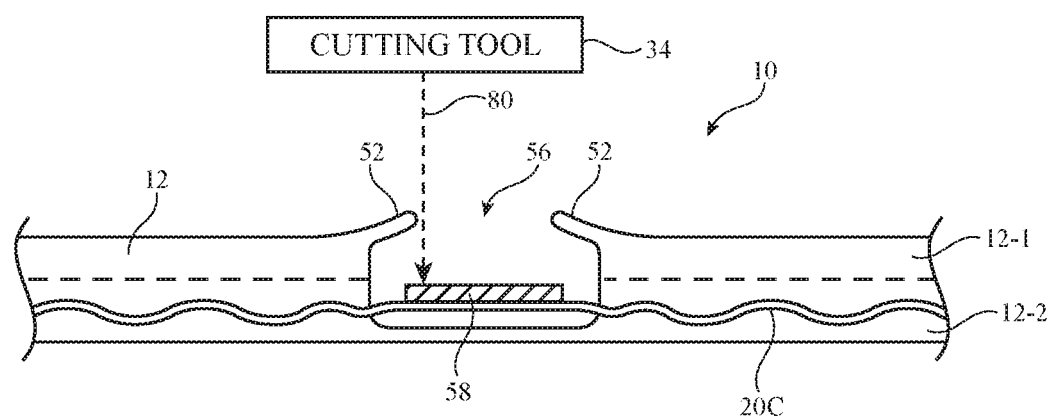
FIG. 8 is a cross-sectional side view of an illustrative fabric-based item of the type shown in FIG. 5 showing how a shim may prevent a cutting tool from penetrating through an overlapping fabric layer in accordance with an embodiment.
Figure 9:
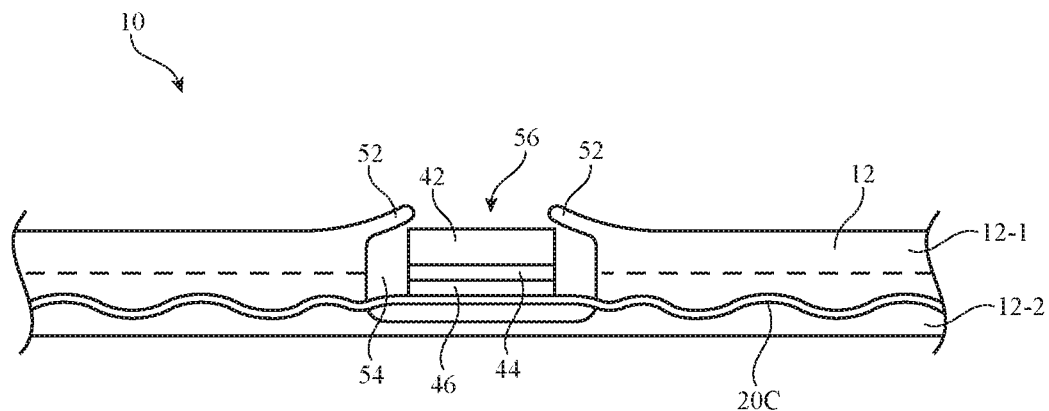
FIG. 9 is a cross-sectional side view of an illustrative fabric-based item of the type shown in FIG. 5 showing how an electrical component may be soldered to a conductive strand in a pocket in accordance with an embodiment.
Figure 10:
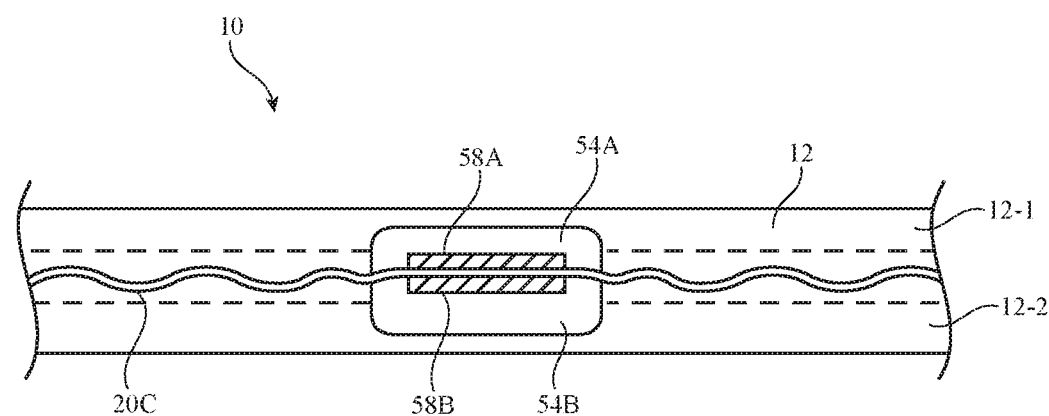
FIG. 10 is a cross-sectional side view of an illustrative fabric-based item of the type shown in FIG. 6 showing how multiple shims may be placed in a pocket in accordance with an embodiment.
Figure 11:
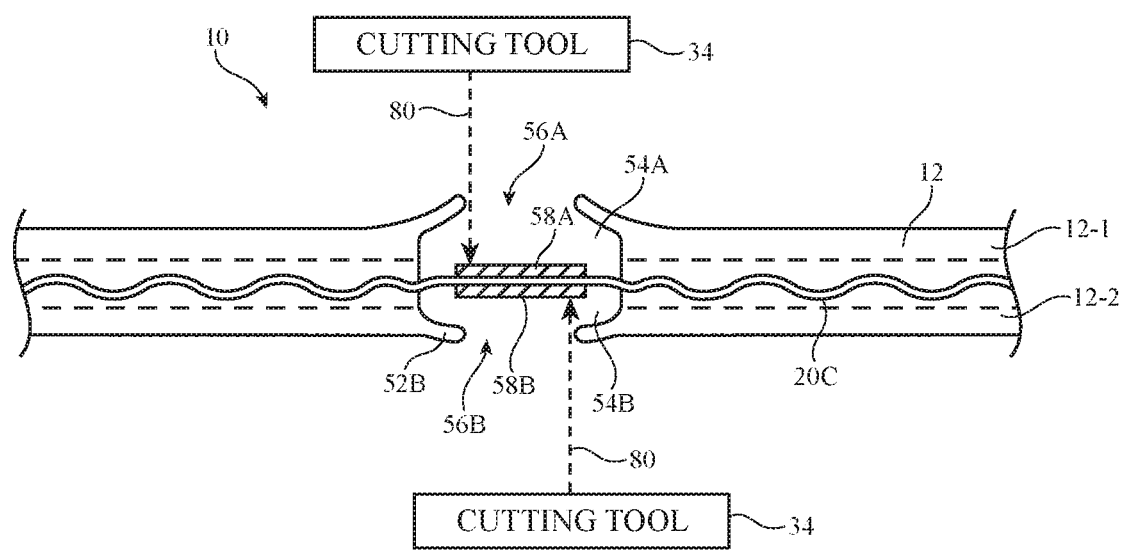
FIG. 11 is a cross-sectional side view of an illustrative fabric-based item of the type shown in FIG. 6 showing how multiple shims may prevent a cutting tool from penetrating through overlapping fabric layers in accordance with an embodiment.
Figure 12:
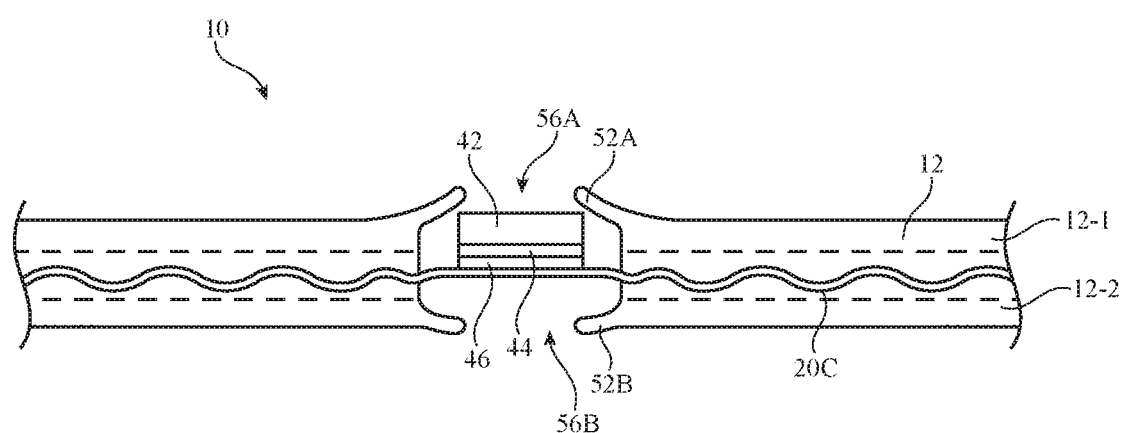
FIG. 12 is a cross-sectional side view of an illustrative fabric-based item of the type shown in FIG. 6 showing how an electrical component may be soldered to a conductive strand in a pocket in accordance with an embodiment.

FIGS. 7-12 illustrate various steps that may be taken during manufacturing to ensure that component 42 may be securely and discretely mounted in fabric 12. FIGS. 7-9 show illustrative steps involved in forming item 10 of FIG. 5. FIGS. 10-12 show illustrative steps involved in forming item 10 of FIG. 6.

As shown in FIG. 7, intertwining equipment 38 may be used to form fabric 12 having a pocket such as pocket 54. Pocket 54 may be formed by creating a gap between first and second layers of fabric 12 such as layers 12-1 and 12-2. Pocket 54 may be fully enclosed by surrounding portions of fabric 12.

During weaving, a shim structure such as shim structure 58 may be inserted into pocket 54 before pocket 54 is completely closed up. This may be achieved by leaving the shed (e.g., the separation between upper and lower warp strands) open temporarily while shim 58 is inserted into pocket 54. After shim 58 is inserted into pocket 54, equipment 38 may resume weaving by closing up pocket 54 and completing the remaining portions of fabric 12.

Shim 58 may be used as a backstop that prevents laser light or other cutting tools from cutting all the way through fabric 12. In particular, shim 58 of FIG. 7 may ensure that laser light or other cutting tools penetrate only through upper fabric layer 12-1 and not through lower fabric layer 12-2. Shim 58 may be a thin plate of metal (e.g., brass or other suitable metal), fiber glass, and/or any other suitable material that is capable of absorbing laser light and/or capable of preventing other cutting tools from cutting past shim 58. When shim 58 is located in pocket 54, shim 58 may overlap conductive strand 20C in pocket 54.

After enclosing shim 58 in pocket 54, cutting equipment may be used to remove a portion of fabric 12 over pocket 54. This step is shown in FIG. 8. As shown in FIG. 8, cutting tool 34 (e.g., a laser cutting tool, a die cutting tool, a knife cutting tool, or other suitable cutting tool) may be used to cut opening 56 in upper layer 12-1. If desired, cutting equipment 34 may include a camera and/or other sensor that is used to monitor for location-specific registration elements on strands 20 of fabric 12 (e.g., stitches, marks, magnetic tags, conductive dots, and/or other markers that are incorporated into fabric 12 to delineate the portions of fabric 12 where opening 56 is to be formed). This may enhance cutting accuracy and thereby ensure that opening 56 is precisely in the appropriate location.

The presence of shim 58 prevents cutting tool 34 from cutting into lower fabric layer 12-2. For example, in arrangements where cutting tool 34 is a laser, shim 58 may absorb laser light 80 so that it does not penetrate into lower fabric layer 12-1. Laser light 80 may be a beam of focused laser light that is scanned across the surface of fabric 12 to create opening 56 in upper fabric layer 12-1. Opening 56 may expose conductors in pocket 54 such as conductive strand 20C. Lower fabric layer 12-2 may remain intact (e.g., without openings) under shim 58 and pocket 54. By cutting opening 56 in upper fabric layer 12-1, upper fabric layer 12-1 may be left with protruding edges 52. Protruding edges 52 may surround opening 56.

After forming opening 56 in upper fabric layer 12-1, shim 58 may be removed and component 42 may be mounted in pocket 54. This step is shown in FIG. 9. Packaging equipment 36 of FIG. 4 (e.g., a pick-and-place tool, other soldering tool, or other mounting equipment) may be used to insert component 42 through opening 56 and solder or otherwise mount component 42 to conductive strand 20C in pocket 54. As shown in FIG. 9, solder 46 may mechanically and electrically couple pad 44 of component 42 to conductive strand 20C. Packaging equipment 36 (e.g., an encapsulation tool) may then be used to encapsulate component 42 by injecting polymer 50 into pocket 54, thereby forming an encapsulated component 42 of the type shown in FIG. 5. The use of shim 58 during manufacturing of item 10 may allow for one side of fabric 12 (e.g., the side of fabric 12 formed by lower layer 12-2) to remain smooth and intact, completely overlapping component 42.

FIGS. 10-12 show illustrative steps involved in forming item 10 of FIG. 6.

As shown in FIG. 10, intertwining equipment 38 may be used to form fabric 12 having a pocket such as pocket 54. Pocket 54 of FIG. 10 may be formed by creating a gap between first and second layers of fabric 12 such as layers 12-1 and 12-2. If desired, there may be additional fabric layers between layers 12-1 and 12-2. Pocket 54 may be fully enclosed by surrounding portions of fabric 12.

During weaving, shim structures such as shim structures 58A and 58B may be inserted into pocket 54 before pocket 54 is completely closed up. This may be achieved by leaving the shed (e.g., the separation between upper and lower warp strands) open temporarily while shims 58A and 58B are inserted into pocket 54. After shims 58A and 58B are inserted into pocket 54, equipment 38 may resume weaving by closing up pocket 54 and completing the remaining portions of fabric 12. Shims 58A and 58B may be separate shim structures or may be different portions of one structure (e.g., a U-shaped shim structure).

Shims 58A and 58B may be used as backstops that prevent laser light or other cutting tools from cutting all the way through fabric 12. In particular, shim 58A of FIG. 10 may ensure that laser light or other cutting tools penetrate only through upper fabric layer 12-1 and not through lower fabric layer 12-2, whereas shim 58B of FIG. 10 may ensure that laser light or other cutting tools penetrate only through lower fabric layer 12-2 and not through upper fabric layer 12-1. Shims 58A and 58B may be thin plates of metal (e.g., brass or other suitable metal), fiber glass, and/or any other suitable material that is capable of absorbing laser light and/or capable of preventing other cutting tools from cutting past shims 58A and 58B. Shims 58A and 58B may have the same size or may have different sizes and may be formed from the same material or different materials. When shims 58A and 58B are located in pocket 54, shims 58A and 58B may overlap conductive strand 20C in pocket 54 (e.g., conductive strand 20C may be interposed between shims 58A and 58B).

After enclosing shims 58A and 58B in pocket 54, cutting equipment may be used to remove portions of fabric 12 over pocket 54. This step is shown in FIG. 11. As shown in FIG. 11, cutting tool 34 (e.g., a laser cutting tool, a die cutting tool, a knife cutting tool, or other suitable cutting tool) may be used to cut opening 56A in upper layer 12-1 and opening 56B in lower layer 12-2. Openings 56A and 56B may be cut at the same time or may be cut at different times. If desired, cutting equipment 34 may include a camera and/or other sensor that is used to monitor for location-specific registration elements on strands 20 of fabric 12 (e.g., stitches, marks, magnetic tags, conductive dots, and/or other markers that are incorporated into fabric 12 to delineate the portions of fabric 12 where openings 56A and 56B are to be formed). This may enhance cutting accuracy and thereby ensure that openings 56A and 56B are precisely in the appropriate locations.

The presence of shim 58A prevents cutting tool 34 from cutting into lower fabric layer 12-2, and the presence of shim 58B prevents cutting tool 34 from cutting into upper fabric layer 12-1. For example, in arrangements where cutting tool 34 is a laser, shims 58A and 58B may absorb laser light 80 so that it does not penetrate past shims 58A and 58B, respectively. Laser light 80 may be a beam of focused laser light that is scanned across the surface of fabric 12 to create opening 56A in upper fabric layer 12-1 and opening 56B in lower fabric layer 12-2. Openings 56A and 56B may expose conductors in pocket 54 such as conductive strand 20C. The use of shims 58A and 58B may allow openings 56A and 56B to have different dimensions and/or different cross-sectional shapes. For example, opening 56A may be round with one set of dimensions, whereas opening 56B may be rectangular with a different set of dimensions. This is merely illustrative, however. If desired, openings 56A and 56B may have the same dimensions and/or cross-sectional shape.

After forming opening 56A in upper fabric layer 12-1 and opening 56B in lower fabric layer 12-2, shims 58A and 58B may be removed and component 42 may be mounted in pocket 54. This step is shown in FIG. 12. Packaging equipment 36 of FIG. 4 (e.g., a pick-and-place tool, other soldering tool, or other mounting equipment) may be used to solder or otherwise mount component 42 to conductive strand 20C in pocket 54. As shown in FIG. 12, solder 46 may mechanically and electrically couple pad 44 of component 42 to conductive strand 20C. Packaging equipment 36 (e.g., an encapsulation tool) may then be used to encapsulate component 42 by injecting polymer 50 into pocket 54, thereby forming an encapsulated component 42 of the type shown in FIG. 6. The portion of pocket 54 above component 42 and the portion of pocket 54 below component 42 may be filled with the same or different polymer 50 and/or may be filled with polymer 50 at the same time or at different times.

The foregoing is merely illustrative and various modifications can be made to the described embodiments. The foregoing embodiments may be implemented individually or in any combination.

What is claimed is:

1. A fabric-based item comprising:
   a first layer of fabric;
   a second layer of fabric intertwined with the first layer of fabric, wherein the first and second layers of fabric at least partially surround a pocket; and
   an electrical component mounted in the pocket, wherein the first layer of fabric has cut edges surrounding an opening that passes through the first layer of fabric without passing through the second layer of fabric, wherein the opening and the cut edges extend over an upper surface of the electrical component.

2. The fabric-based item defined in claim 1 further comprising:
   a conductive strand of material that passes through the pocket, wherein the electrical component is mounted to the conductive strand.

3. The fabric-based item defined in claim 2 further comprising:
   an encapsulant in the pocket that encapsulates the electrical component.

4. The fabric-based item defined in claim 3 wherein the encapsulant comprises polymer.

5. The fabric-based item defined in claim 3 wherein the encapsulant interlocks with the cut edges.

6. The fabric-based item defined in claim 3 further comprising solder that electrically couples the electrical component to the conductive strand.

7. The fabric-based item defined in claim 3 wherein the electrical component is selected from the group consisting of: a sensor and a light-emitting diode.

8. The fabric-based item defined in claim 3 further comprising an additional conductive strand that passes through the pocket, wherein the electrical component comprises a first terminal coupled to the conductive strand and a second terminal coupled to the additional conductive strand.

9. A fabric-based item, comprising:
   a first fabric layer having cut fabric edges that surround an opening;
   a second fabric layer having a region without openings, wherein the first and second fabric layers are intertwined together and at least partially surround a cavity; and
   an electrical component mounted to a conductor in the cavity and aligned with the opening, wherein the cut fabric edges extend over the electrical component and wherein the conductor is interposed between the electrical component the region without openings of the second fabric layer.

10. The fabric-based item defined in claim 9 wherein the conductor comprises a conductive strand that passes through the cavity.

11. The fabric-based item defined in claim 10 further comprising:
    polymer material that fills the cavity and encapsulates the electrical component.

12. The fabric-based item defined in claim 9 wherein the electrical component is selected from the group consisting of: a sensor and a light-emitting diode.

13. The fabric-based item defined in claim 9 further comprising solder that electrically couples the electrical component to the conductor.

14. An item, comprising:
    first and second fabric layers;
    a pocket located between the first and second fabric layers;
    a conductive strand that passes through the pocket; and
    an electrical component mounted to the conductive strand in the pocket, wherein the first fabric layer has cut edges that define an opening aligned with the electrical component and wherein the cut edges protrude over the electrical component; and
    an encapsulant in the opening, wherein the encapsulant interlocks with the cut edges.

15. The item defined in claim 14 wherein the encapsulant encapsulates at least part of the electrical component in the pocket.

16. The item defined in claim 14 wherein the electrical component is soldered to the conductive strand.

17. The item defined in claim 14 wherein the first and second fabric layers are woven together.

18. The item defined in claim 14 wherein the encapsulant comprises a thermoplastic polymer.

19. The item defined in claim 14 wherein the electrical component comprises an optical component.

* * * * *